United States Patent
Daley, III

(10) Patent No.: US 9,501,101 B2
(45) Date of Patent: *Nov. 22, 2016

(54) BAG COMPUTER DISPLAY PANEL FRAME

(71) Applicant: Charles Augustus Daley, III, Rawai (TH)

(72) Inventor: Charles Augustus Daley, III, Rawai (TH)

(*) Notice: Subject to any disclaimer, the term of this patent is extended or adjusted under 35 U.S.C. 154(b) by 0 days.

This patent is subject to a terminal disclaimer.

(21) Appl. No.: 14/544,865

(22) Filed: Feb. 27, 2015

(65) Prior Publication Data

US 2015/0177787 A1    Jun. 25, 2015

Related U.S. Application Data

(63) Continuation of application No. 13/507,442, filed on Jun. 29, 2012, now abandoned, which is a continuation-in-part of application No. 13/374,252, filed on Dec. 19, 2011, now Pat. No. 8,867,199, and a continuation-in-part of application No. 12/927,884, filed on Nov. 30, 2010, now Pat. No. 8,605,415.

(51) Int. Cl.
| | | |
|---|---|---|
| *G06F 1/16* | (2006.01) | |
| *G06F 1/18* | (2006.01) | |
| *H05K 5/02* | (2006.01) | |

(52) U.S. Cl.
CPC ............ *G06F 1/1637* (2013.01); *G06F 1/163* (2013.01); *G06F 1/1681* (2013.01); *G06F 1/181* (2013.01); *H05K 5/0217* (2013.01); *H05K 5/0226* (2013.01)

(58) Field of Classification Search
CPC combination set(s) only.
See application file for complete search history.

(56) References Cited

U.S. PATENT DOCUMENTS

| | | | | | |
|---|---|---|---|---|---|
| 5,217,119 | A | * | 6/1993 | Hollingsworth | G06F 1/1628 190/102 |
| 5,222,642 | A | * | 6/1993 | Solarz | A45C 13/08 224/191 |
| 5,445,266 | A | * | 8/1995 | Prete | A45C 7/0086 190/102 |
| 5,494,157 | A | * | 2/1996 | Golenz | A45C 3/02 190/111 |
| 5,678,666 | A | * | 10/1997 | Shyr | A45C 5/14 190/102 |
| 5,774,338 | A | * | 6/1998 | Wessling, III | G06F 1/163 2/94 |
| 5,887,723 | A | * | 3/1999 | Myles | G06F 1/1626 206/305 |
| 5,887,777 | A | * | 3/1999 | Myles | A45F 3/02 190/102 |
| 5,908,147 | A | * | 6/1999 | Chuang | G06F 1/1628 190/100 |
| 6,105,764 | A | * | 8/2000 | Scicluna | A45C 13/02 190/111 |
| 6,161,738 | A | * | 12/2000 | Norris | A45C 9/00 109/49.5 |
| 6,167,413 | A | * | 12/2000 | Daley, III | G06F 1/163 345/8 |
| 6,283,299 | B1 | * | 9/2001 | Lee | H04N 5/64 206/320 |
| 6,393,745 | B1 | * | 5/2002 | Miki | G09F 27/00 224/627 |
| 6,597,568 | B2 | * | 7/2003 | Ryder | G06F 1/1628 206/576 |
| 6,685,016 | B2 | * | 2/2004 | Swaim | A45C 7/0095 206/320 |

(Continued)

*Primary Examiner* — Lisa Lea Edmonds

(57) ABSTRACT

The disclosed invention is a frame used to mount a display to a bag or other object. The frame includes a prop to press against the bag front and hold a display angle relative to the bag. The frame may be adapted to hold thin film display and touch control units, may be light weight and hollow, may include a camera or other tools and may be in two parts to hold the display/control unit. The frame may include finger guides on its back side, may be shaped to fit the operator's hands and may be adapted to attach to the object using an attachment flap.

50 Claims, 12 Drawing Sheets

(56) References Cited

U.S. PATENT DOCUMENTS

| | | | |
|---|---|---|---|
| 6,763,942 B1* | 7/2004 | Yeh | A45C 5/03 190/119 |
| 6,769,588 B2* | 8/2004 | Zheng | A45C 15/00 190/1 |
| 6,883,693 B2* | 4/2005 | Han | A45C 13/36 224/245 |
| 6,956,614 B1* | 10/2005 | Quintana | G06F 1/163 348/158 |
| 6,962,277 B2* | 11/2005 | Quintana | A45F 3/14 224/262 |
| 6,986,447 B2* | 1/2006 | Truong | B60R 11/0229 224/275 |
| 7,265,970 B2* | 9/2007 | Jordan | G09F 21/02 361/679.27 |
| 2004/0134813 A1* | 7/2004 | Domotor | A45C 3/02 206/320 |
| 2005/0000843 A1* | 1/2005 | Zheng | A45C 15/00 206/457 |
| 2005/0011920 A1* | 1/2005 | Feng | B60R 7/043 224/275 |
| 2005/0045673 A1* | 3/2005 | Godshaw | A45C 7/0036 224/153 |
| 2005/0103815 A1* | 5/2005 | Lee | B60K 35/00 224/275 |
| 2006/0042996 A1* | 3/2006 | Picot | A45C 13/02 206/586 |
| 2006/0113203 A1* | 6/2006 | Daley | A45C 5/02 206/320 |
| 2006/0113213 A1* | 6/2006 | Daley, III | A45C 5/02 206/576 |
| 2006/0144663 A1* | 7/2006 | Gullen | A45C 13/02 190/110 |
| 2006/0163303 A1* | 7/2006 | Trutanich | A45F 3/04 224/576 |
| 2007/0151881 A1* | 7/2007 | Zheng | A45C 15/00 206/320 |
| 2007/0199844 A1* | 8/2007 | Daley, III | A45C 5/02 206/320 |
| 2007/0199851 A1* | 8/2007 | Yau | B42D 3/123 206/472 |
| 2007/0201201 A1* | 8/2007 | Daley, III | G06F 1/1628 361/679.27 |
| 2008/0161753 A1* | 7/2008 | Gillespie | A61M 5/142 604/65 |
| 2008/0192421 A1* | 8/2008 | Daley | A45C 13/02 361/679.23 |
| 2008/0237250 A1* | 10/2008 | Swansey | A45C 13/30 220/756 |
| 2008/0273298 A1* | 11/2008 | Daley | G06F 1/1628 361/679.4 |
| 2008/0289886 A1* | 11/2008 | Burkitt | G06F 3/0202 178/18.03 |
| 2009/0009476 A1* | 1/2009 | Daley, III | G06F 1/1616 345/168 |
| 2009/0009938 A1* | 1/2009 | Daley, III | A45C 5/03 361/679.09 |
| 2009/0027632 A1* | 1/2009 | Choi | G03B 21/58 353/98 |
| 2009/0046416 A1* | 2/2009 | Daley, III | G06F 1/1628 361/679.55 |
| 2009/0141446 A1* | 6/2009 | Daley, III | G06F 1/1628 361/679.55 |
| 2009/0185342 A1* | 7/2009 | Daley, III | G06F 1/1628 361/679.27 |
| 2009/0190296 A1* | 7/2009 | Daley, III | G06F 1/1628 361/679.27 |
| 2009/0201637 A1* | 8/2009 | Daley, III | G06F 1/1628 361/679.29 |
| 2009/0225508 A1* | 9/2009 | Daley, III | G06F 1/1628 361/679.27 |
| 2009/0225509 A1* | 9/2009 | Daley, III | G06F 1/1628 361/679.29 |
| 2009/0284908 A1* | 11/2009 | Daley, III | G06F 1/1628 361/679.17 |
| 2009/0321490 A1* | 12/2009 | Groene | A45C 11/00 224/576 |
| 2010/0050485 A1* | 3/2010 | Forte | G09F 21/02 40/1.5 |
| 2010/0256561 A1* | 10/2010 | Gillespie, Jr. | A61M 5/142 604/151 |
| 2011/0051362 A1* | 3/2011 | Daley, III | G06F 1/1628 361/679.55 |
| 2011/0102992 A1* | 5/2011 | Daley, III | G06F 1/1628 361/679.03 |
| 2011/0164366 A1* | 7/2011 | Daley, III | G06F 1/163 361/679.03 |
| 2011/0267754 A1* | 11/2011 | Daley, III | A45C 11/00 361/679.03 |
| 2012/0008261 A1* | 1/2012 | Daley, III | G06F 1/163 361/679.01 |
| 2012/0106055 A1* | 5/2012 | Daley, III | G06F 1/163 361/679.03 |
| 2012/0275102 A1* | 11/2012 | Daley, III | G06F 1/163 361/679.03 |
| 2014/0049893 A1* | 2/2014 | Daley, III | G06F 1/1607 361/679.26 |
| 2014/0313653 A1* | 10/2014 | Daley, III | G06F 1/1637 361/679.03 |
| 2015/0205327 A1* | 7/2015 | Daley, III | A45F 3/10 361/679.03 |

* cited by examiner

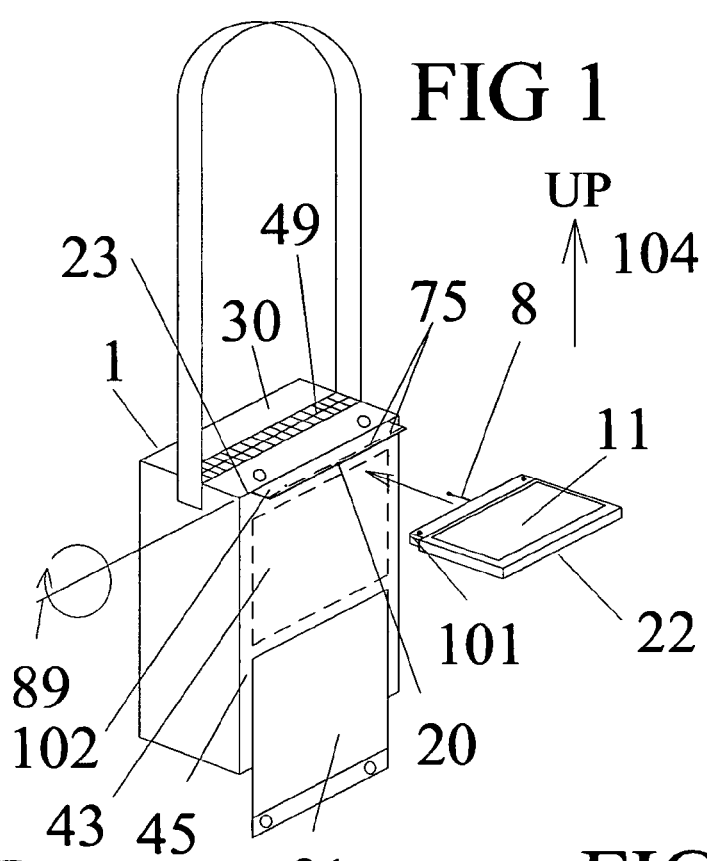
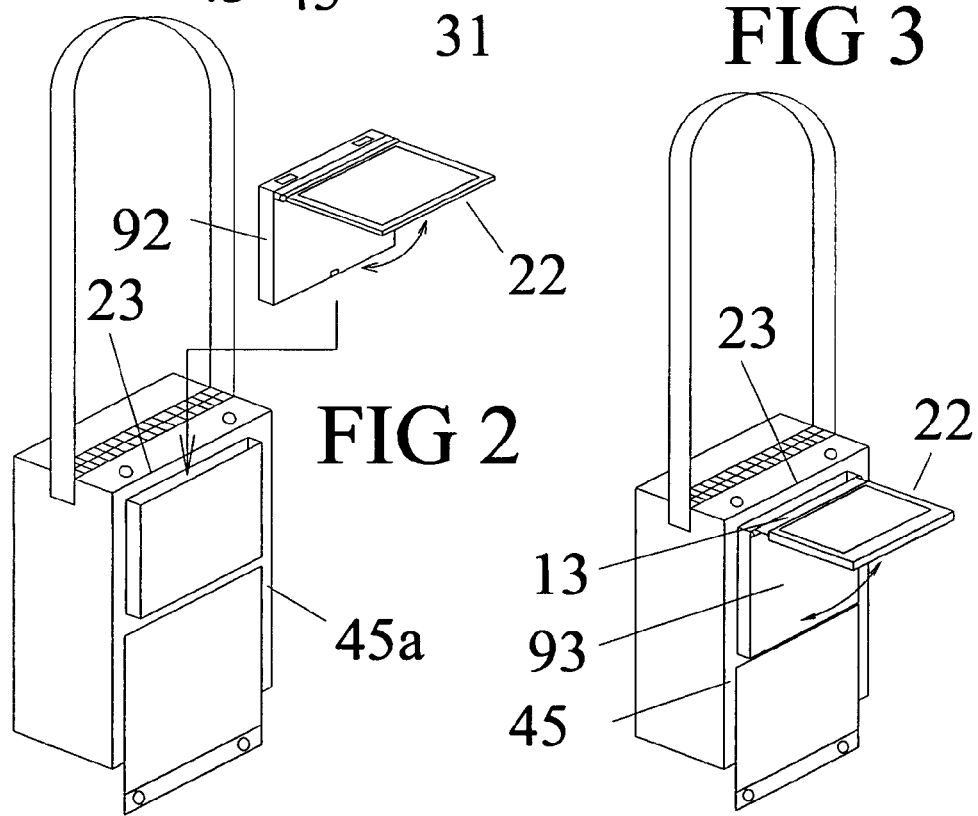

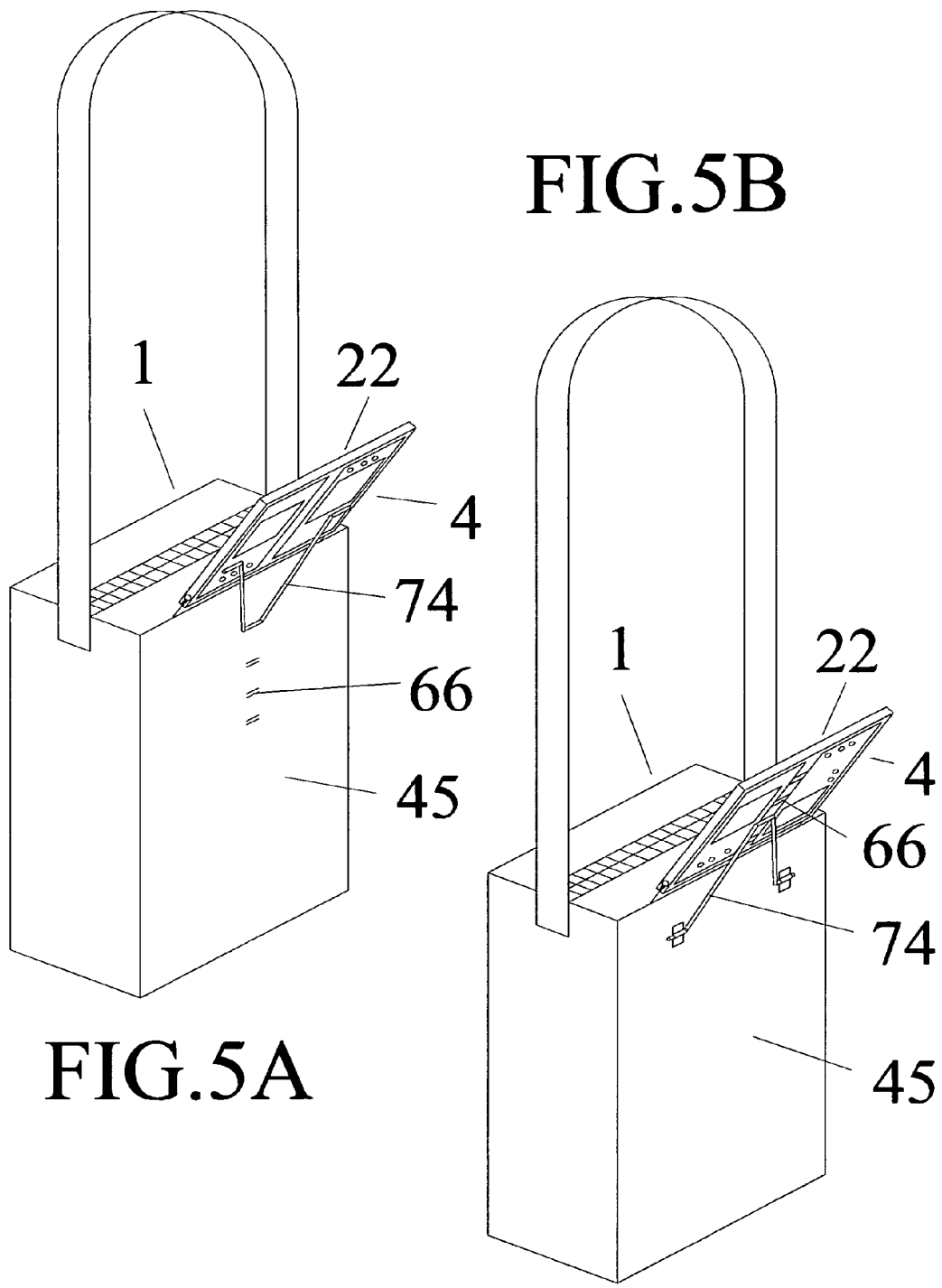

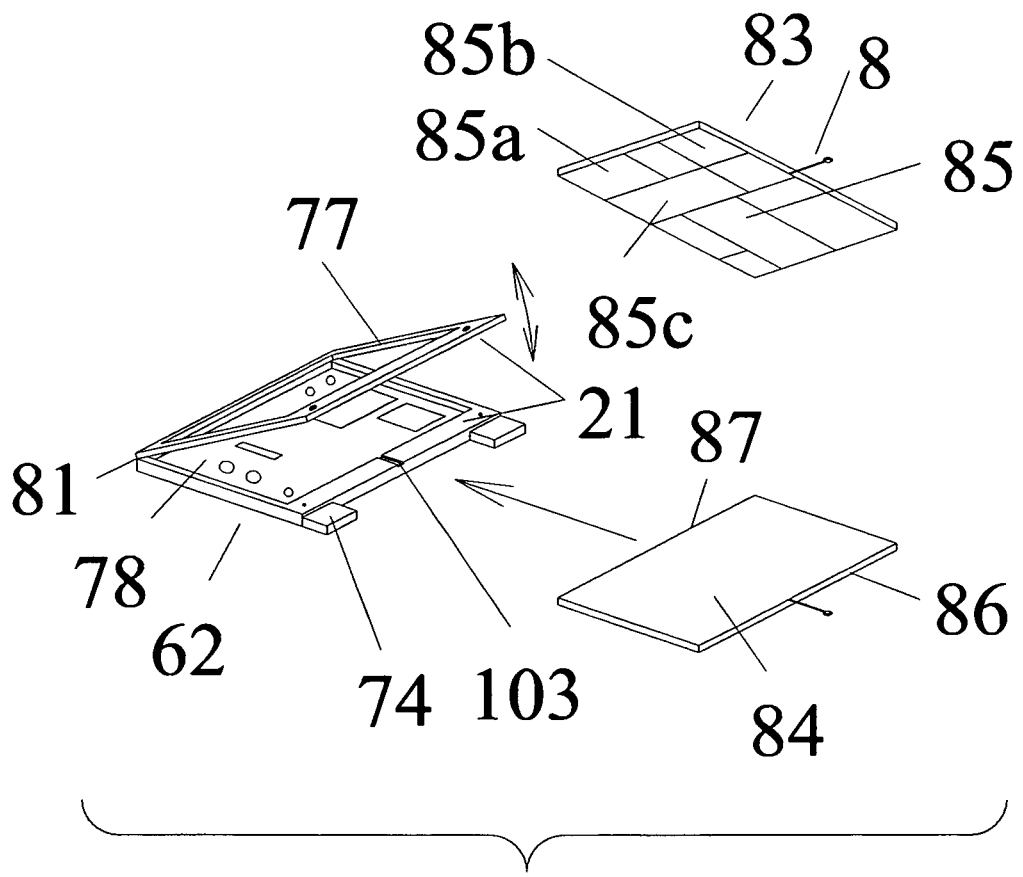

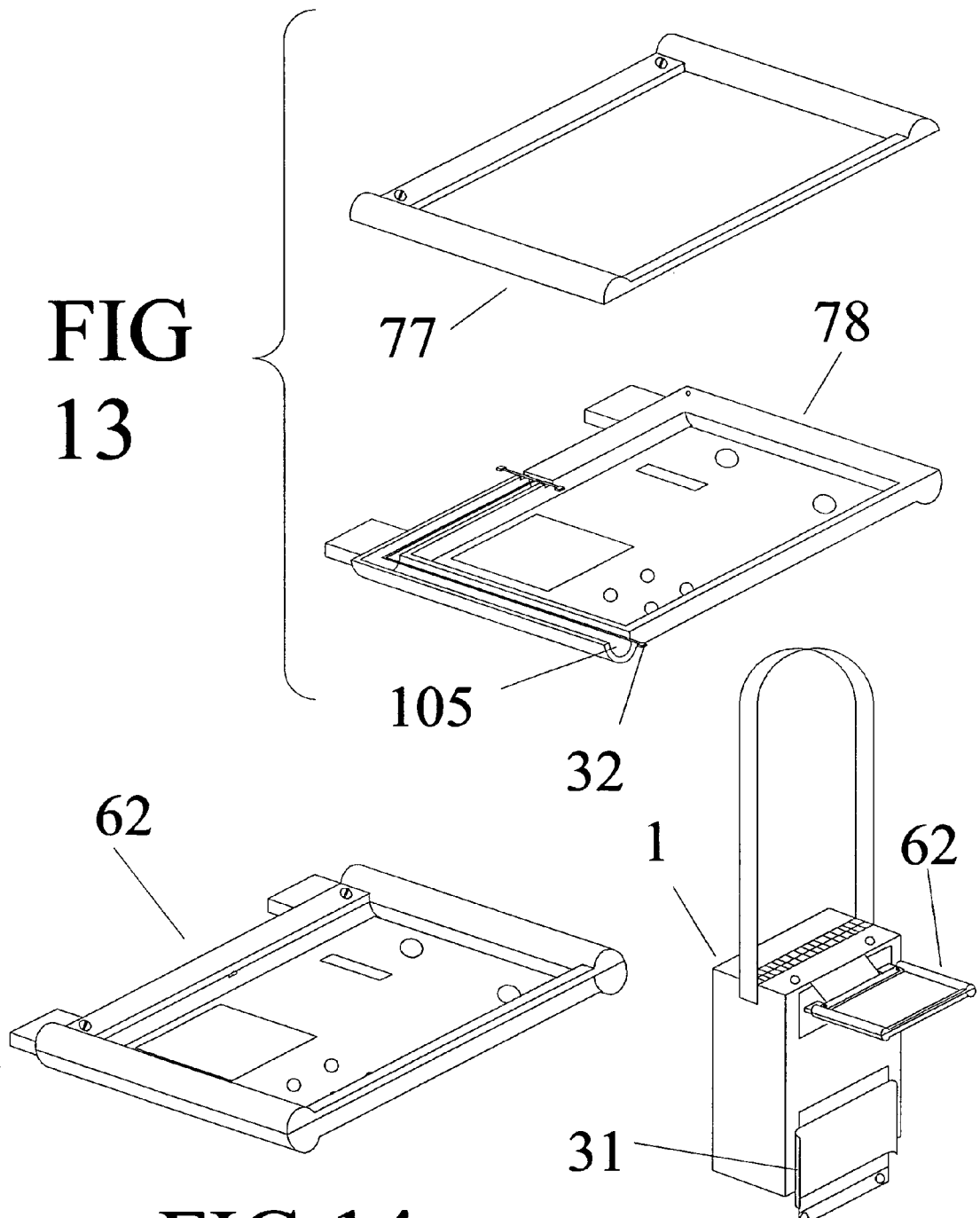

BAG COMPUTER DISPLAY PANEL FRAME

CROSS-REFERENCE TO RELATED APPLICATIONS

This application is a Continuation application of copending patent application Ser. No. 13/507,442 filed on Jun. 29, 2012, which is a Continuation-In-Part of U.S. application Ser. No. 13/374,252, filed Dec. 19, 2011, and is a Continuation-In-Part of U.S. application Ser. No. 12/927,884, filed Nov. 30, 2010. The disclosures of all of these U.S. patent applications are incorporated herein by reference.

TECHNICAL FIELD

The present invention relates to a computer display designed for mobile use.

BACKGROUND OF THE INVENTION

Bag computers are composed of a bag and computer joined so that the display panel pivots around the top front end of the bag so it can lay approximately flat against the bag front when stored or pivot with its display facing outward into the line of sight of the operator when in use. There may be a keyboard lower down on the bag front and there may be manual controls on the back of the display panel.

The bag computer was described in applications Ser. No. 11/796,920. This application is a continuation on those inventions.

One characteristic of the most popular computers is division into components. This allows the computer owner to buy or replaces less expensive individual components when needed. Choice can be made between various prices and makers so the owner can optimize the result of his array of options. Manufacturers, as well, may benefit from being able to concentrate of the production of one type of component. This invention aims to build on the bag computer concept by encouraging owner replaceable components for bag computers.

This type of display panel attachment frame may be easily manufactured to take advantage of thin film technology, plastics and design to produce a display which is both durable and light weight, possibly less than 120 grams.

BRIEF DESCRIPTION OF THE INVENTION

A bag computer may include a display panel pivoting on the bag front. The display panel may include a front side display and a back side control such as a touchpad. Back side finger guides may be included to easily find touch pad control positions. A front side touch screen may also be provided.

The display panel may be divided into several parts. It may be divided into a front side display panel portion or back side display panel portion. In this case, a fastening frame with finger guides may be included to attach the two together. Alternatively, the display panel may be divided into an attachment frame along with the front side display panel portion, back side display panel portion or display/control combination panel it holds.

The attachment frame may have a slot to hold the display and/or control panels. Instead, the attachment frame may be in two sides to hold the display and/or control panels between.

The attachment frame may include a prop to hold the display panel at various angles relative to the bag front. In this case, the attachment frame is suspended by a free section which may be an attachment flap or an attachment filament (for right to left pivoting of the display) extending between the bag and attachment frame. The props press against and abut the bag front and hold the display panel at angles.

The attachment frame may be hollow to lighten and strengthen its structure and to allow passage of electrical connections to tools, such as a camera, mounted on the frame. The frame may have two parts to clamp a thin film display/control unit between the two parts. The attachment frame may be shaped to be easily handled. The attachment frame may be adapted to mount on other objects such as an apron, clipboard, or wall.

BRIEF DESCRIPTION OF THE SEVERAL VIEWS OF THE DRAWINGS

FIG. 1 This figure shows a bag computer with a display panel pivotally attached to the bag near the junction of the top and front walls.

FIG. 2 This figure shows the bag computer with the display panel attached to a body which is held to the bag from.

FIG. 3 This figure shows the bag computer with the display panel pivotally attached to the bag front and including a holder which positions the display panel to pivot near the junction of the top and front walls.

FIG. 5A This is a drawing of the display panel mounted to the bag and including a prop pivoting on the display panel.

FIG. 5B This is a drawing of the display panel mounted to the bag and including a prop pivoting on the bag front.

FIG. 9A This drawing shows that the front and back attachment frame sides may be hinged together to hold the display/control combination panel between and forming the display panel.

FIG. 9B This drawing shows a bottom view of the display/control combination panel with several areas of touch pad controls.

FIG. 13 This drawing shows the attachment frame in two pieces and shaped to be easy to handle.

FIG. 14 This drawing shows the attachment frame pieces combined and shaped to be easy to handle.

FIG. 15 This drawing show the display panel mounted to the bag which includes a pivoting cover shaped to match the display panel.

DETAILED DESCRIPTION OF THE INVENTION

Figure 10A:
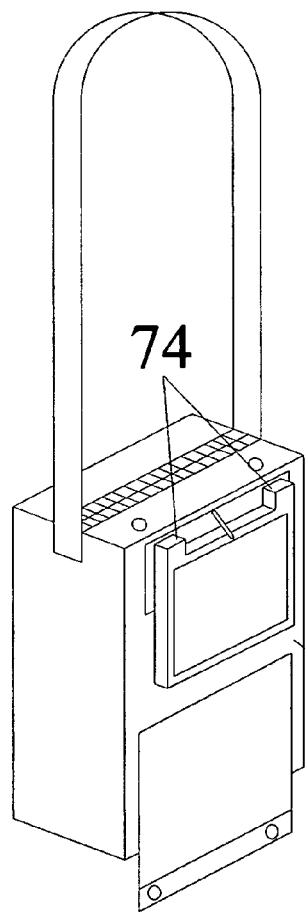
FIG. 10A This drawing shows the display panel in storage position and including propping legs and a filament pivotally holding the display panel to the bag.
Figure 10B:
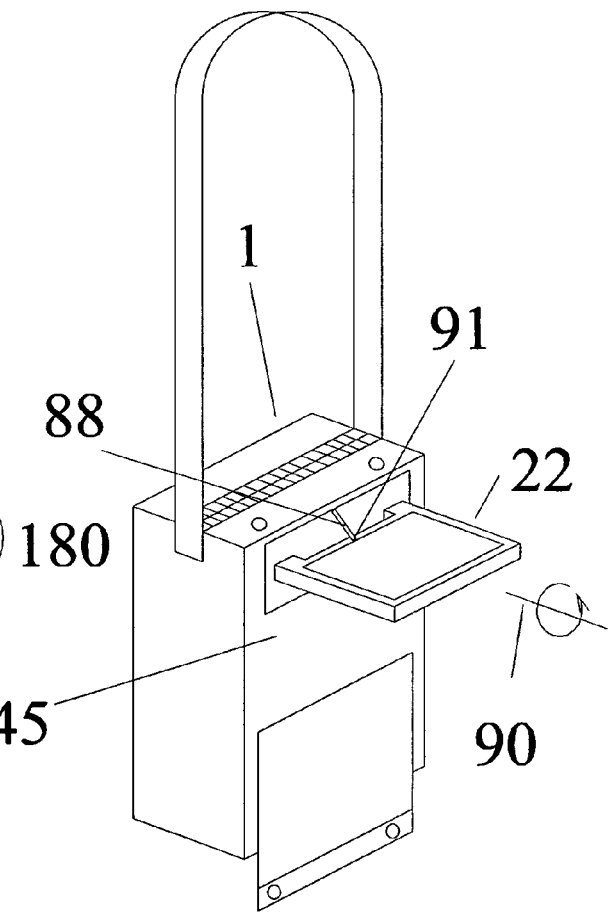
FIG. 10B This drawing shows the display panel in operating position and including propping legs and a filament pivotally holding the display panel to the bag.
Figure 11A:
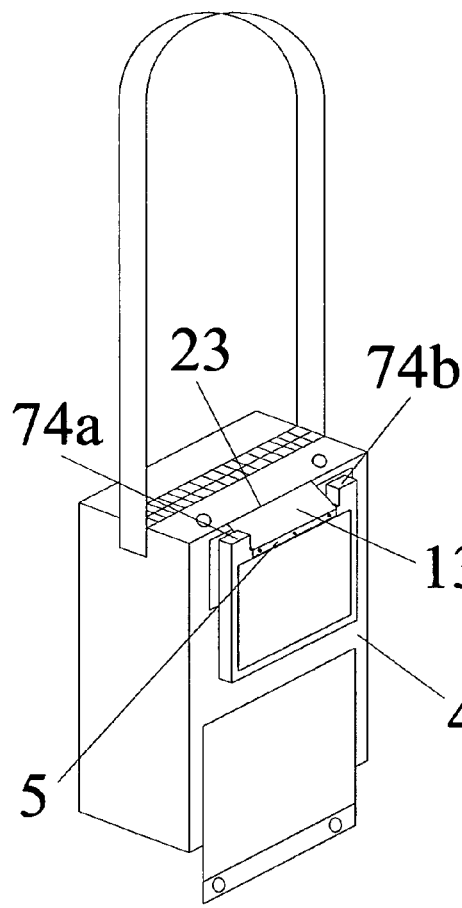
FIG. 11A This drawing shows the display panel in storage position and including propping legs to each side of an attachment flap pivotally holding the display panel to the bag. This arrangement braces the display panel so it does not swing from side to side.
Figure 11B:
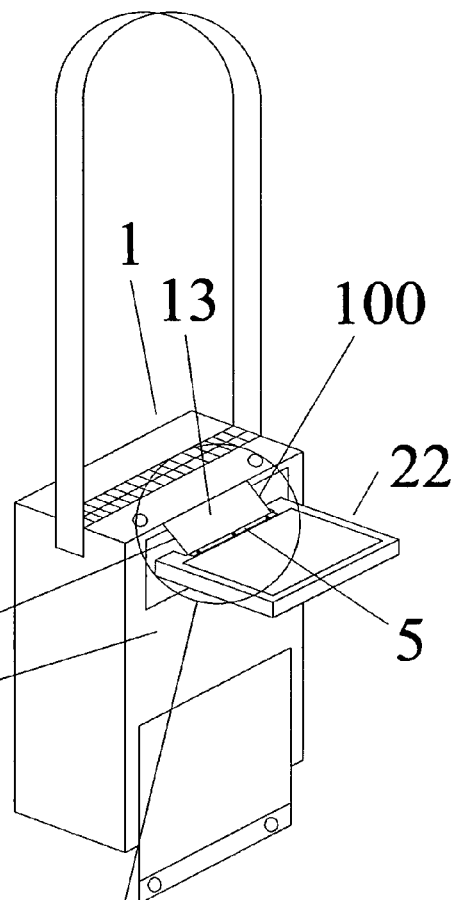
FIG. 11B This drawing shows the display panel in operating position and including propping legs to each side of an attachment flap pivotally holding the display panel to the bag. This arrangement braces the display panel so it does not swing from side to side.

As shown in FIG. 1, the bag computer is comprised of a bag 1 with a pivoting display panel 22 having a display 11 facing upward 104 toward the wearer/operator when the display panel is pivoted away from and approximately perpendicular to the bag front and in an operating position (shown in FIGS. 3, 10B and 11B). The bag may have a front wall 45, a top wall 30 (showing its outside surface) with an opening 49 to access the interior of the bag. Each wall has an outside surface and an opposite inside surface. The outside surface of the bag front wall may include a computer equipment storage area 43 (approximate area on bag front bounded by the dotted line) and the bag may include a pivoting cover 31 to protect the equipment in the storage area. The cover may be attached near the bottom of the computer storage area and pivot to selectively cover or expose the computer storage area. The display panel is attached to the bag so that it may pivot on a first horizontal axis 89 near the junction of the top and front bag walls 23 or near the top end of the front wall 23. In operating position, the display panel is pivoted away from the bag front into the line of sight of a bag computer wearer/operator. When stored, the display panel is approximately parallel to the bag front and in the computer equipment storage area.

The display panel may be attached to the bag in a variety of ways. The display panel may be attached to the bag using a pivoting computer equipment mount (PCEM) which may be located on the exterior of a bag wall, for example, near the junction of the top and front bag walls or near the top end of the front wall.

The pivoting computer equipment mount is comprised of a display panel part 101, in this case a clamp on or near the display panel attachment edge, and a bag part 102, in this case an attachment flap on the bag front, which together attach the equipment (display panel) to the bag and allow it to pivot. Alternative pivoting computer equipment mounts may include axle and bearing, attachment flap with sliding channels, or other means to pivotally attach the display to the bag.

The attachment flap may have attachment feature 75 such as holes, stitching, channel or other attachment meant to match some feature on the display panel and assist in attaching it to the bag.

FIG. 2 shows that the display panel 22 may be pivotally attached to a body panel 92 which is attached to the outside surface of the bag front wall 45a. The display panel pivots near the junction of the top and front walls 23. Alternatively, shown in FIG. 3, the display panel 22 may be attached to the bag with a support structures on the bag front wall 45 comprised of an attachment flap 13 and a pocket-like holder 93. Again, the display panel pivots near the junction of the top and front walls 23. There may be still other ways to attach the display panel to the bag while allowing it to pivot between a storage position in the computer equipment storage area and an operating position away from the bag front. The objective is to position the display panel on the bag close to the operator/wearer of the bag so that the display's apparent size is maximized while allowing the display panel to be quickly stored on the bag front so it may be used without access in the interior of the bag.

The display panel may include a computing unit. Alternatively, the computing unit may be located elsewhere and the display panel provided with an electrical connection 8, shown in FIG. 1, leading to a computing unit, peripherals or batteries, which may be stored inside the bag. The bag may include an appropriately located electrical access opening 20 to allow the connection to pass through a bag wall. The electrical access opening may be part of the pivoting computer equipment mount, such as an attachment flap, with the electrical connection passing from the display panel between two layers of flap material before passing through a wall to the bag interior.

Shown in FIGS. 4A, 4B, 4C, and 4D, the display panel is panel-like with a front side (FIG. 4A), back side (FIG. 4C), attachment edge 5 and distal edge 6. The display panel may include a right side edge 7a and a left side edge 7b. There is a display 11 on the front side and it may include a touch screen 69 (shown as a stylus drawing a line). The back side may include one or more controls 50. The controls may be in the form of a pointing device such as a touchpad 9. The touch pad may be one continuous piece or may be divided into segments. There may be finger guides 55 associated with or covering the controls or touchpad. The controls may be arranges to point with one hand (right hand) and click with the other hand while the operator holds the display panel with two hands.

The display panel may have an electrical connection 32 and this connection may be in the form of an electrical wire. The display panel may include a camera 105.

The display panel may include one or more propping parts used to prop the display panel at various angles relative to the bag front wall. For example, the display panel may include one or more prop holders 66 designed to receive the end of a prop. The prop holder may be designed to pivotally or slidably hold a prop.

There may be included one or more props 74 fixed to or near the attachment edge of the display panel or to the attachment end of the front side display panel portion or back side display panel portion. The prop may be molded into a part of the display panel, attachment frame or its sides or may be a separate attachable part. This prop may be in line with the plane of the display panel or it may be at some angle relative to the plane of the display panel. Alternatively, this prop may be pivotally attached.

Figures 4A, 4B, 4C:
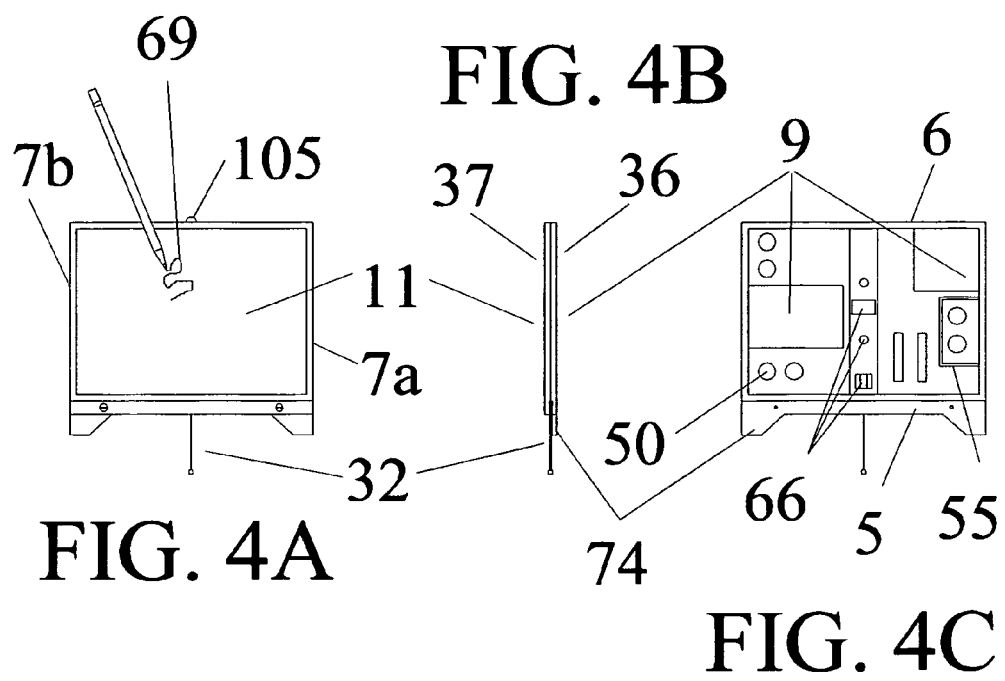
FIG. 4A This is a view of the front side of the display panel.
FIG. 4B This is a view of the side of the display panel.
FIG. 4C This is a view of the back side of the display panel.
Figure 4D:
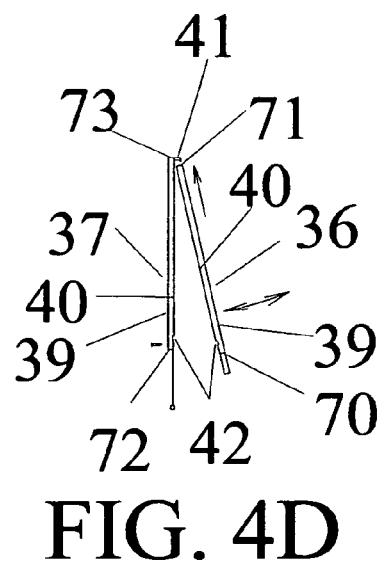
FIG. 4D This is a view of the side of the display panel with the front side and beck side being separated.

Shown in FIG. 4D, the display panel may be constructed with the display on the front side display panel portion 37 and the controls on the back side display panel portion 36. Each portion has an inward 40 and outward 39 facing surface and the display and controls are found on the outward facing surfaces so they can be used by the operator. The two portion display panel arrangement may give advantage in terms of replacement ability of the portions and ease of construction.

The front side display panel portion has an attachment end 72 and an opposite distal end 73 and the back side display panel portion also has an attachment end 70 and an opposite distal end 71. The panel portion attachment ends may form the display panel attachment edge or be near to the proximal edge of an attachment frame. Similarly, the distal ends may form the display panel distal edge or be near to the distal edge of an attachment frame.

In the shown arrangement the two portions may attach together with their inward facing surfaces together. In this case there is an attachment means 41, such as a hook, near the distal end and a two jaw clamping attachment means 42 near the attachment end. The clamping may be used both to attach the two panel portions and as a clamping part of the pivoting computer equipment mount which matches and attaches the display panel to an attachment flap on the bag.

Shown in FIG. 5A, the back side 4 of the display panel 22 may include a pivotally attached prop 74 to match prop fixtures, such as one or more holders 66, on the bag 1 front wall 45. FIG. 5B shows that the pivotally attached prop 74 may be attached to the bag front and the holders 66 located on the display panel back side.

Figure 6A:
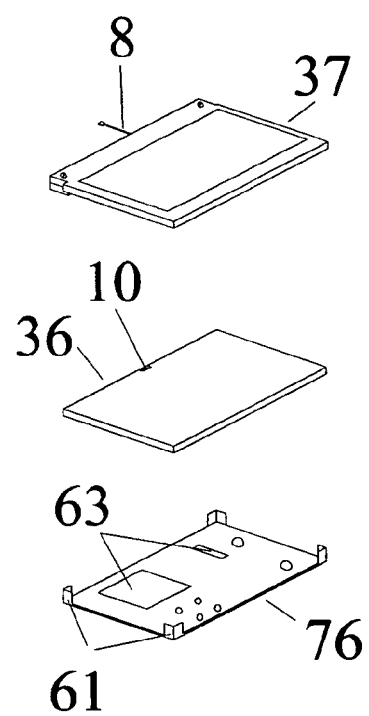
FIG. 6A This drawing shows a top view of a front side and a back side of the display panel made to attach together using a fastening frame.
Figure 6B:
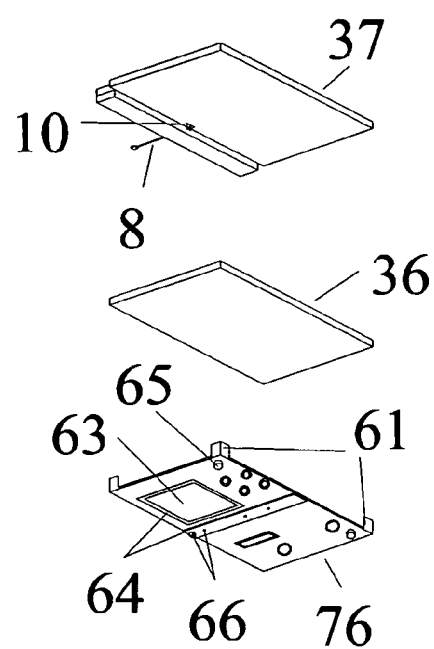
FIG. 6B This drawing shows a bottom view of a front side and a back side of the display panel made to attach together using a fastening frame.

Shown in FIG. 6A (viewed from above angle) and FIG. 6B (viewed from below angle), the attachment means attaching the front side display panel portion 37 and the back side display panel portion 36 together may be a fastening frame 76. The fastening frame may include control access opening 63 through which the back side controls can be accessed. The fastening frame may include finger guides 64, such as ridges around control access openings to help the operator find specific position and controls on the back side display panel portion. The fastening frame may also include prop fixtures, such as a prop or prop holders 66, to assist in propping the display panel in various angles relative to the bag front wall.

The fastening frame may have attachments 61, such as clips, for holding the fastening frame, front side display panel portion 37 and back side display panel portion 36 together. The fastening frame may include bumpers 65 to soften the contact between or provide a gap between the backside of the display panel and the bag front wall.

Shown here, the front side display panel portion and back side display panel portion may have electrical connections, such as wires 8, plugs or sockets 10, for electrically connecting them to each other and/or to a computing unit, peripheral or batteries located elsewhere on or in the bag.

Figure 7:
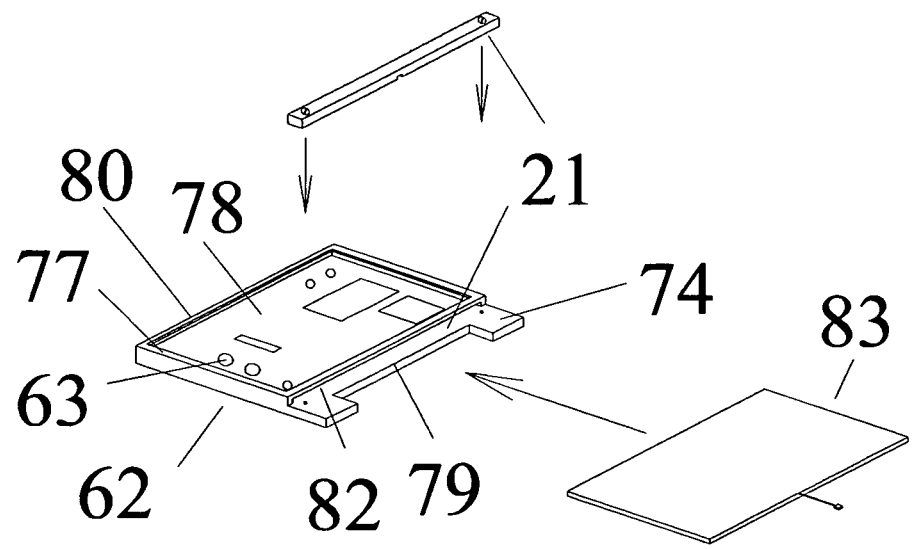
FIG. 7 This drawing shows a one part attachment frame with a slide-in display/control combination panel, forming the display panel.
Figure 7A:
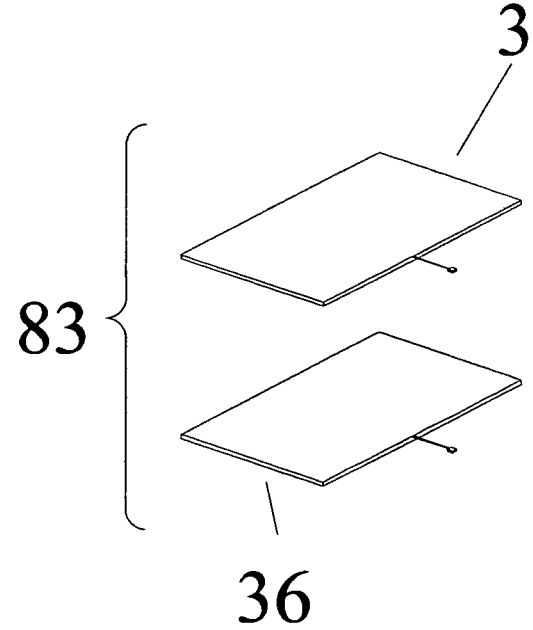
FIG. 7A This drawing shows the display/control combination panel comprised of a front side display panel portion, a back side display panel portion FIG. 8A In this drawing, a top view, the attachment frame has as separate front and back sides to hold the display/control combination panel between, forming the display panel.

Shown in FIG. 7 and FIG. 7A (with the display/control combination panel in two portions), the display panel maybe comprised of an attachment frame 62 which may hold a front side display panel portion 37, a back side display panel portion 36 and/or a display/control combination panel 83 to the bag. The front side display panel portion, a back side display panel portion and/or a display/control combination panel may be made of thin film and may be made using thin film technology (TFT). The attachment frame may have a front side 77 which maybe reduced to a rim to hold the display panel portions or combination panel in place. The attachment frame may have a back side 78, this view showing the inside surface of the back side, which may also be a rim or may include finger guides and/or finger guide openings 63 which allow access to the back side display panel portion or combination panel control side (see 85—FIG. 9B) such as a touch pad. The attachment frame has a proximal edge 79 on or near which a pivoting computer equipment mount display panel part may be located. This mount is designed to match a pivoting computer equipment mount bag part on the bag and attach the attachment frame to the bag. The attachment frame may have a distal edge 80. When the attachment frame is assembled, the attachment frame proximal edge may be the same as the display panel attachment edge. The attachment frame may have props 74 which may be leg-like extensions of the display panel on or near the proximal edge.

The pivoting computer equipment mount display panel part may be a clamp with two jaws 21 meant to attach to an attachment flap on the bag.

The attachment frame may have a slot 82 fitting and designed for slidably receiving the front side display panel portion, a back side display panel portion and/or a display/control combination panel 83 onto the attachment frame. Here, one of the clamp jaws may be used to hold the display panel portions or combination panel in place and the clamp may include a notch to allow an electrical connection to pass by without damage.

Figure 8A:
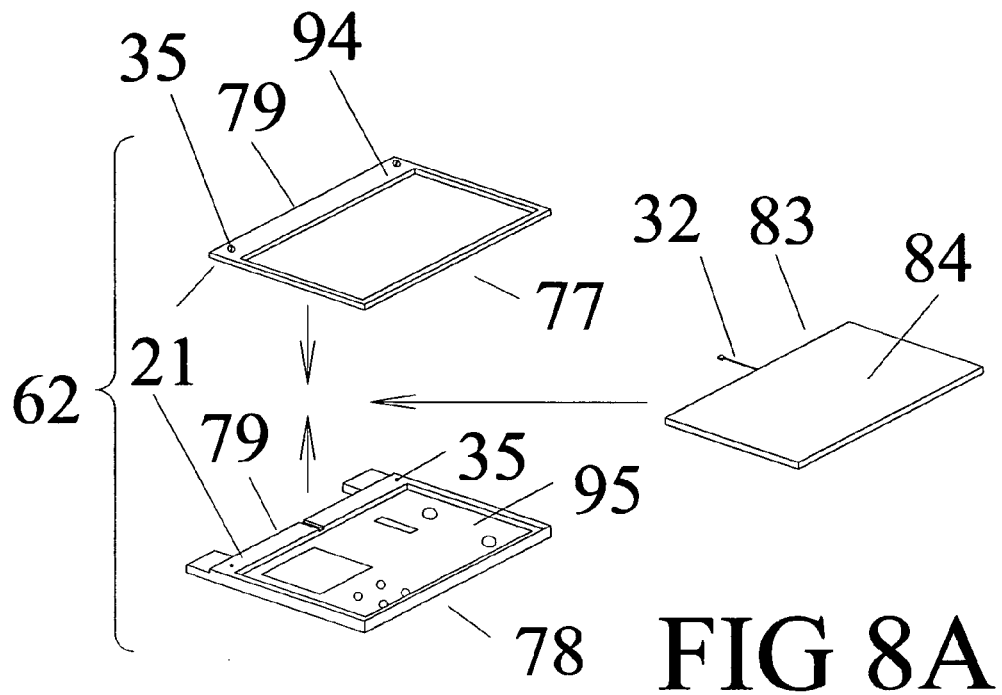
FIG. 8B In this drawing, a bottom view, the attachment frame has as separate front and back sides to hold the display/control combination panel between, forming the display panel.
Figure 8B:
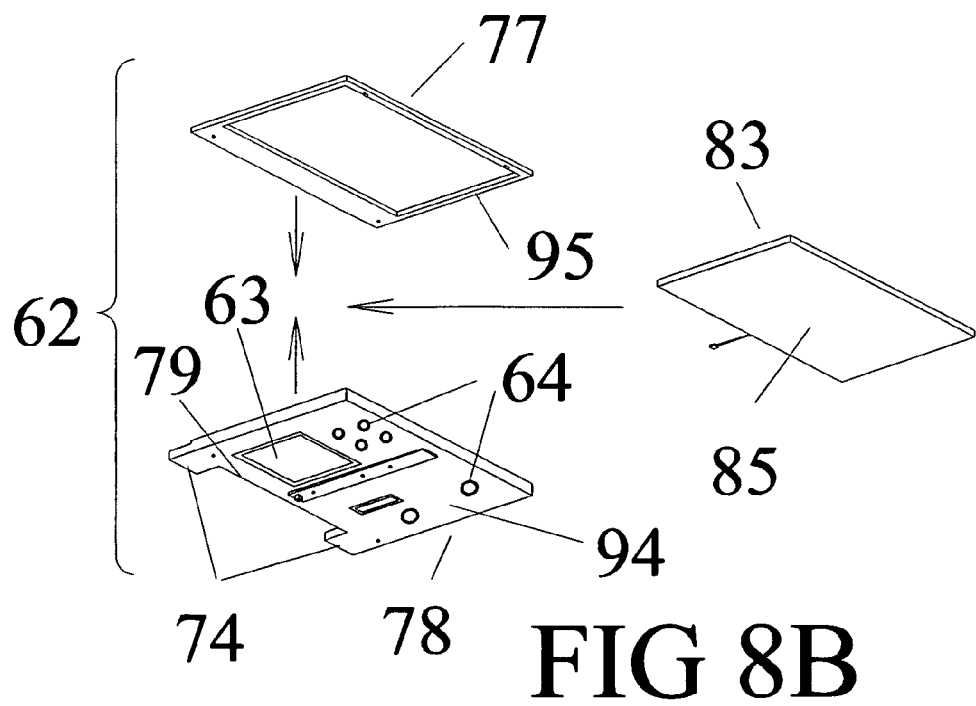

Shown in FIG. 8A, a view from the top, and FIG. 8B, a view from the bottom, the attachment frame 62 front side 77 and back side 78 may be separate parts. Each of the sides has a proximal edge 79, closest to the connection with the bag when installed, an outward facing surface 94 and inward facing surface 95. These two parts may be held together with attachments 35 such as screws and sockets, clips or other matching attachment parts.

The two attachment frame sides are configured to hold the display/control combination panel 83 between them. The two parts may form a clamp for the display/control panels.

The attachment frame back side may include finger guide openings 63 and/or finger guide ridges 64 to facilitate locating and accessing the controls.

The attachment frame front side may include an opening to view the display.

On or near the proximal edge 79 of the front side 77 and/or back side 78 there may be located a pivoting computer equipment mount display panel part to hold the attachment frame to the bag. In this case the pivoting computer equipment mount is a clamp with two jaws 21 comprised of the proximal edge areas of the front and back attachment frame sides. Near the proximal edge of the front side and/or back side there may be one or more props 74 to abut the bag front and hold the display panel at angled relative the bag front.

The display/control combination panel 83 includes a display panel side 84 with a display and a control side 85 with at least one control. The display/control combination panel may include an electrical connection 32 designed to connect the panel to electrical equipment attached to the bag or peripherals held within the bag. The connection may be a wire with a connector such as a plug or socket.

FIG. 9A shows that the attachment frame 62 front side 77 and back side 78 may be separate parts. These parts may be pivotally attached on an edge, for example, with a hinge or with a frame with shape and flexible frame material in the pivoting axis 81 suitable for pivoting. The front side display panel portion, a back side display panel portion and/or a display/control combination panel may be installed into the attachment frame between the two parts and the two parts closed together, in this case with two clamping jaws 21. A separate pivoting computer equipment mount display panel part of any sort may be used on or near the proximal edge of either the front side, back side or both sides to attach the attachment frame front to the bag. The attachment frame front side and/or back side parts may be shaped to fit and hold the display panel portions or display/control combination. One or both of the clamping parts may include a notch 103 to allow an electrical connection to pass by without damage.

The attachment frame may include one or more prop fixtures, such as one or more props 74 fixed to the frame near the proximal edge or to the back side. The prop may be pivotally attached to the attachment frame.

Instead of a front side display panel portion and/or a back side display panel portion, a display/control combination panel may be used in the attachment frame. The display/control combination panel is a single panel that has a display side 84 that includes a display, a proximal end 86, closest to the attachment frame proximal edge when installed, and a distal end 87, distal to the attachment frame proximal edge. When installed into the attachment frame, the display side is next to and showing through the attachment frame front side and the control surface is next to and accessible through the attachment frame back side.

Shown in FIG. 9B, the display/control combination panel 83 has a control side 85 which includes controls. The controls may be a touch pad and this may be segmented into several separate touch pads (for example 85*a*, 85*b*, 85*c*) to match finger guide openings and sense different control signals from the operator. The touch pads may include controls for a camera mounted to the frame such as a scroll for digitally aiming the camera and/or a control for inverting the image. The display/control combination panel may have an electrical connection 8 to connect the panel with a computing unit, peripheral or batteries.

The attachment edge of the display panel is the place of attachment of the pivoting attachment to the bag. The attachment edge may be the entire edge of the display panel or it may be just a portion of the edge of the display panel. If a prop is included on the display panel attachment edge and extends from the right side edge to left side edge of the display panel, especially when the prop is on a plane parallel to the display panel, the attachment edge may not seem to be on an edge of the display panel but, rather, somewhat distal from an edge and on the front or back side of the display panel. The attachment edge is the place of attachment of the display panel to the pivoting computer equipment mount bag part. As shown in FIG. 10A and FIG. 10B, the attachment edge of the display panel 22 may be an attachment point 91. The attachment point allows the connection of a filament 88, such as a cord, electrical wires or other flexible line, from the bag 1 to the display panel. This kind of attachment may be used in conjunction with one or more props 74 fixed to the display panel (at the attachment edge for example) to allow the display to pivot a second horizontal axis 90 perpendicular to the plane of the bag front wall 45. This type of propping means is simple to make and use and is adapted to use gravity to hold the display panel at angles relative to the surface of an object, especially where the surface is vertical. The display panel can prop at angles approximately 0 to 180 degrees 180 relative to an up/down axis (the pull of gravity).

Figure 11C:
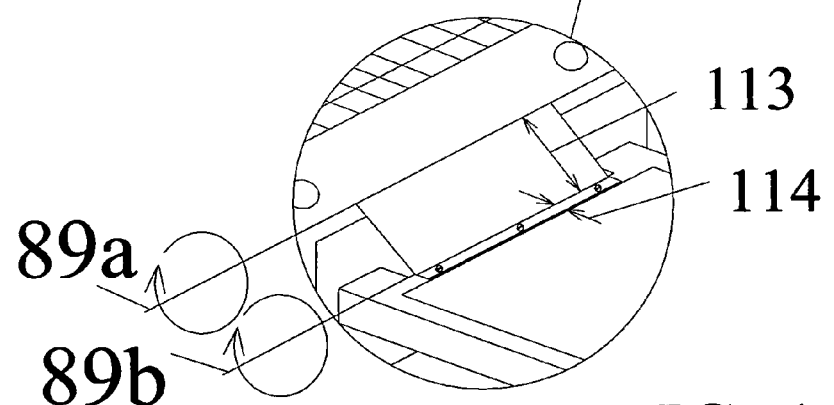
FIG. 11C This is a magnified view of the attachment flap area of FIGS. 11A and 11B. It shows that the attachment flap can pivot along two axes to perform pivoting and propping.

As shown in FIG. 11A (storage position), FIG. 11B (operating position) and FIG. 11C (magnification of the attachment flap region) the bag's 1 display panel 22 may include two props, a right prop 74*a* and left prop 74*b*, located to the right and left of a free section 113 (here shown as an attachment flap 13) right edge 99 and free section left edge 100. When the display panel is in the storage position approximately parallel to and in front of the bag front (FIG. 11A), the props are nearer the junction 23 of the top and front walls than the attachment edge 5 and are not under the attachment flap. Thus the props act as levers against the free section (shown as an attachment flap) to hold the display panel in the storage position and the attachment flap is directly between the top/front wall junction and the attachment edge instead of passing over the thickness of the display panel. In this arrangement, the props can function as storage levers against the free section or attachment flap to assist in holding the display panel against the bag's front wall 45 while in storage position and prevent the display panel from swinging from side to side.

The attachment flap may include a movable free section 113 holding the display panel to the bag and suspending it in various angles, and a distal section 114, used to attach the attachment flap to the display panel. As the free section suspends the display panel, the props 74*a*, 74*b* abut the bag front and hold the display panel at angles relative to the bag front.

In this case, the attachment flap is a type of attachment means with two horizontal pivot axes parallel to the bag front (FIG. 11C). The two horizontal pivot axes are the first horizontal pivot axis parallel to the bag front 89*a* (near the bag) and second horizontal pivot axis parallel to the bag front 89*b* (near the display panel). Instead of an attachment flap, the attachment means with two horizontal pivot axes may be, for example, a plastic or leather sheet with hinge means at the first horizontal pivot axis and second horizontal pivot axis, a wire bent to form two axles near the two axes with connecting side bars or other means to attach the two horizontal pivot axes with some distance between them. Other arrangement maybe imagined.

The attachment flap may be attached to the display panel in a variety of means including a clamp or axle matching a loop sewn in the end of the attachment flap.

Figure 12:
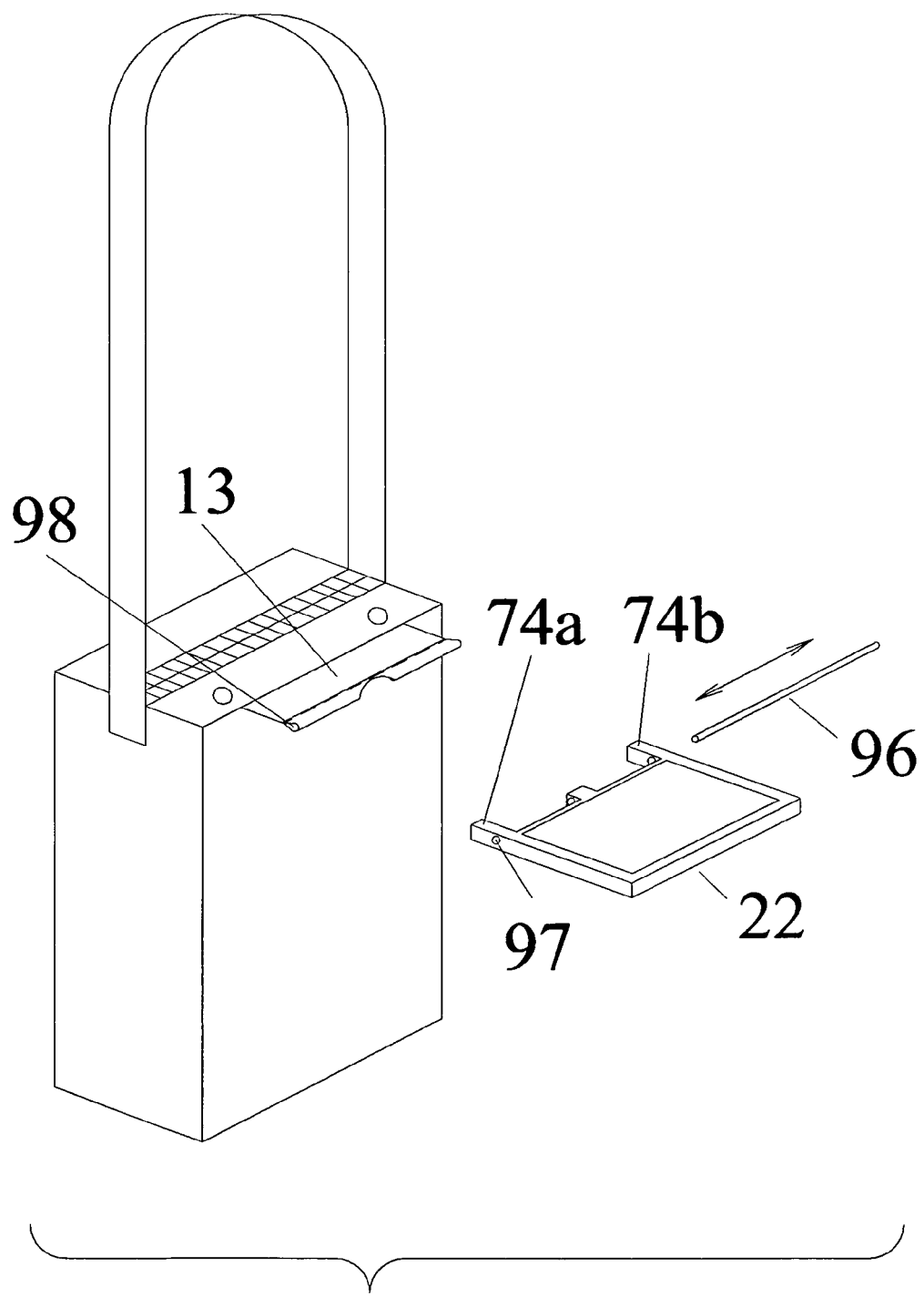
FIG. 12 This drawing shows that an axle and fabric loop bearing can be used to attach the display panel to the attachment flap.

Shown in FIG. 12, the display panel 22 may be attached to the attachment flap 13 using a display panel axle 96 which passes through one or more display panel bearings 97 and through one or more attachment flap loops 98 at the end of the attachment flap distal to the bag. In this case, the axle comprises the attachment edge of the display panel. The right prop 74*a* and the left prop 74*b* may be located to the right and left of the attachment flap so they are not under the attachment flap when the display panel is in storage position.

As shown in FIGS. 13 and 14, the attachment frame 62 front side 77 and attachment frame back side 78 may be shaped so that when they are attached the frame is easier for the operator to handle. Also shown, there the frame may be hollow 105 such as including one or more channels, to pass an electrical connection 32 from a tool located on the frame (such as a camera) through the frame and out of the frame to connect to other electrical equipment. The hollow frame combined with a thin film front side display panel portion, a back side display panel portion and/or a display/control combination panel can make the display panel simpler to make and lighter in weight. The frame may be made of light weight molded plastic, plastic foam, foam filled plastic film (such as Mylar or other polyester film), or other light weight material.

As shown in FIG. 15, the pivoting cover 31 of the bag 1 may be shaped to fit the shape of the display panel frame 62.

Figure 16A:
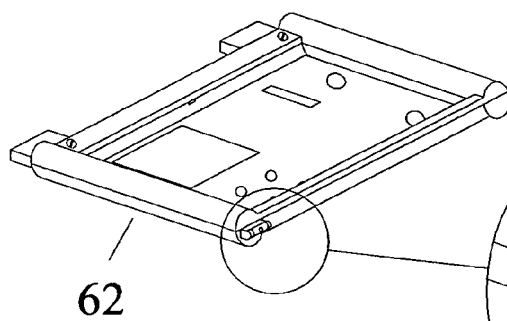
FIG. 16A This drawing shows the attachment frame including a camera which is designed to swivel to aim at the operator or at some distant object.
Figure 16B:
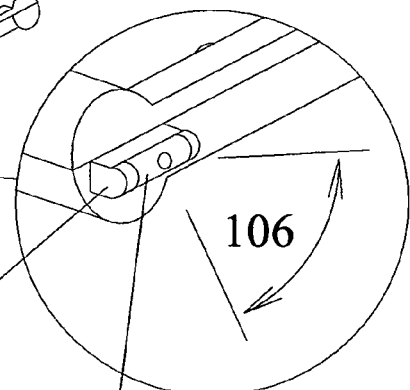
FIG. 16B This drawing is a magnified view of the camera shown in FIG. 16A.

Shown in FIG. 16A and magnified in FIG. 16B, the attachment frame 62 may include a camera 105 positioned for easy use. The camera may include a swivel 108 designed to allow the camera to physically move and face at an angle 106 (for example, greater than 180 degrees) so as to allow the camera image to show the operator/wearer's face (toward operator) or, alternatively, to show the image that the operator is looking at (away from operator).

Figure 17A:
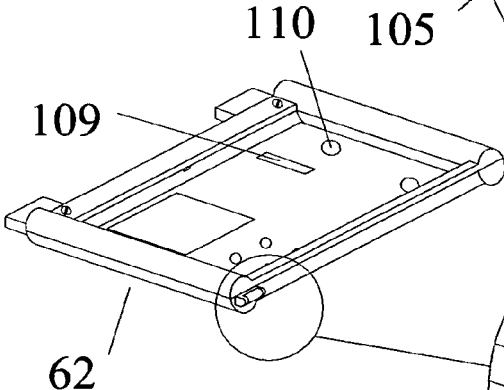
FIG. 17A This drawing shows the attachment frame including a camera which has a wide angle lens to electronically/digitally aim the camera at the operator or at some distant object.
Figure 17B:
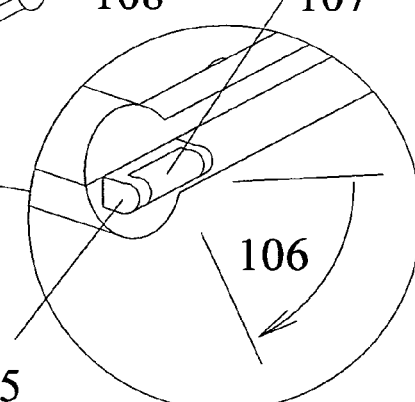
FIG. 17B This drawing is a magnified view of the camera shown in FIG. 17A.

Alternatively, as shown in FIGS. 17A and 17B (magnified) the attachment frame 62 camera 105 may include a wide angle or ultra-wide angle lens 107 such as a "fish-eye" lens with a large angle 106 (for example, greater than 180 degrees) along one axis. The large angle of the lens may be oriented to pan on an axis parallel to the pivoting computer equipment mount pivoting angle. This type of lens may be combined with a matching image receiving unit which is designed with pixel distribution to takes away the distortion allowing the operator to digitally/electronically pan a large angle to allow the camera image to show toward or away from the operator. The wide angle of the lens may be oriented to pan on an axis parallel to the pivoting computer equipment mount pivoting angle. The back side of the display panel may include controls to aim the camera. These may include a control, such as a touchpad, with matching scroll finger guide 109 and/or a control, such as a touchpad, and matching finger guide 110 for inverting the camera image. The lens may have mirroring or polarization to reduce glare.

Figure 18A:
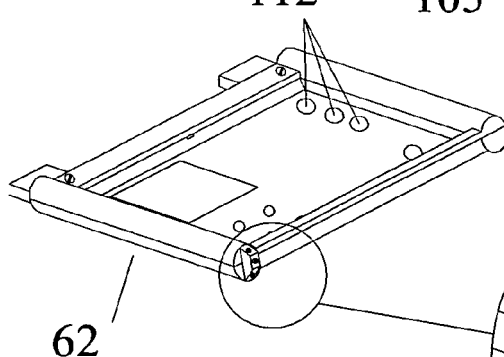
FIG. 18A This drawing shows the attachment frame including a camera comprised of three lens/receiving units facing three directions.
Figure 18B:
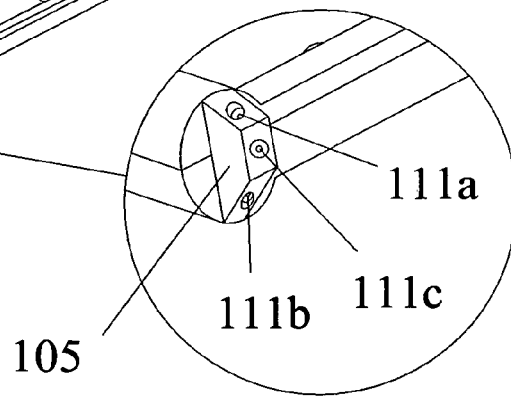
FIG. 18B This drawing is a magnified view of the camera shown in FIG. 18A.

In a third alternative, Shown in FIGS. 18A and 18B (magnified), the camera 105 may be comprised of three lens/receiving units 111 facing in different directions, for example, facing 90 degrees from each other. The lens/receiving unit image to alternatively show the operator/wearer's face 111a (toward operator) the image that the operator is looking at 111b (away from operator) or the image shown an angle between those two 111c (away from the attachment frame distal edge). The choice of lens/receiving unit may be selected by one or more finger guides 112 on the frame.

The invention claimed is:

1. An electronic computing device for mobile use comprised of:
   a. a bag comprised of an interior and a front wall including a top end, an inside surface and an outside surface including a computer equipment storage area;
   b. a computing unit panel attached to the bag in the computer equipment storage area; and
   c. a display panel including a front side with a display, a back side and an attachment edge, wherein the display panel is pivotally attached to the bag so the display panel can pivot from a storage position in the computer equipment storage area to an operating position.

2. The computing device of claim 1 wherein the display panel is pivotally attached to the bag near the top end of the bag front wall.

3. The computing device of claim 1 wherein the front wall is further comprised of a computing unit panel holder configured to hold the computing unit panel in the computer equipment storage area.

4. The computing device of claim 1 wherein the display panel is further comprised of a control.

5. The computing device of claim 4 wherein the control includes a touch pad on the back side of the display panel.

6. The computing device of claim 4 wherein the display includes a touch screen control.

7. The computing device of claim 1 wherein the display panel is attached to the bag by the display panel attachment edge.

8. The computing device of claim 1 wherein the display panel is attached to the bag using a pivoting computer equipment mount that includes an attachment flap.

9. The computing device of claim 1 further comprised of one or more attachments on the computing unit panel, one or more matching attachments on the outside surface of the bag front wall and an opening in the bag front wall, wherein the attachments hold the computing unit panel in the computer equipment storage area and the opening is configured to allow an electrical connection of an electrical device in the bag interior to the computing unit panel.

10. The computing device of claim 1 wherein the computing unit panel is comprised of a front computing unit panel part including one or more attachments and a back computing unit panel part including one or more matching attachments and the bag front wall is further comprised of one or more holes wherein the front computing unit panel part in the computer equipment storage area is configured to attach to the back computing unit panel part on the inside surface of the bag front wall using the one or more attachments through the one or more holes in the bag front wall.

11. The computing device of claim 10 further comprised of one or more electrical connections on the back computing unit panel part wherein at least one electrical connection electrically connects to the front computing unit panel part.

12. The computing device of claim 10 further comprised of an electrical connection on the back computing unit panel part wherein the electrical connection is configured to electrically connect to an electrical device in the interior of the bag.

13. The computing device of claim 1 further comprised of an electrical connection box attached to the inside surface of the bag front wall and an electrical connection configured to electrically connect the electrical connection box to the computing unit panel wherein the electrical connection box is adapted to electrically connect the computing unit panel to electrical equipment in the bag interior.

14. The computing device of claim 1 further comprised of an electrical connection between the computing unit panel and the display panel.

15. A bag for holding an electronic computing device for mobile use comprised of:
   a. a bag comprised of an interior and a front wall including a top end, an inside surface and an outside surface including a computer equipment storage area;
   b. one of a holder on the front wall and one or more holes in the front wall configured to attach a computing unit panel to the bag in the computer equipment storage area; and
   c. a pivoting computer equipment mount attached to the bag and configured to pivotally attach a display panel to the bag wherein the display panel can pivot from a storage position in the computer equipment storage area to an operating position.

16. The bag of claim 15 wherein the pivoting computer equipment mount is attached to the bag near the top end of the bag front wall.

17. The bag of claim 15 wherein the pivoting computer equipment mount includes an attachment flap.

18. The bag of claim 15 wherein the bag front wall is further comprised of an opening configured to allow an electrical connection of an electrical device located in the interior of the bag to the computing unit panel in the computer equipment storage area.

19. The bag of claim 15 wherein the one or more holes in the bag front wall are configured to attach a back computing unit panel part on the inside surface of the bag front wall through the bag front wall to a front computing unit panel part in the computer equipment storage area.

20. The bag of claim 15 further comprised of an electrical connection box attached to the inside surface of the bag front wall and an electrical connection from the connection box through the bag front wall and electrically connectable to the computing unit panel wherein the connection box is configured to electrically connect an electrical device in the bag interior to the computing unit panel.

21. The bag of claim 15 wherein the pivoting computer equipment mount is configured to hold a display panel by an attachment edge of the display panel.

22. An electronic computing device for attaching to an outside surface of a bag wall, the electronic computing device comprised of:
   a. a computing unit panel including a back surface and one or more attachments configured to match one or more attachments on the outside surface of the bag wall; and
   b. one of an electrical connection and a control on the computing unit panel back surface wherein the computing unit panel back surface is configured to be accessible from a bag interior through an opening in the bag wall.

23. An electronic computing device for attaching to a bag wall, the electronic computing device comprised of:
   a. a front computing unit panel part including one or more attachments;
   b. a back computing unit panel part including one or more attachments matching the attachments on the front computing unit panel part, wherein the back computing unit panel part attachments are configured to attach to the front computing unit panel part attachments through one or more holes in the bag front wall and hold the two parts to the bag wall with the bag wall between the two parts;
   c. an electrical connection from the front computing unit panel part to the back part computing unit panel part; and
   d. an electrical connection on the back computing unit panel part configured to electrically connect one of the back computing unit panel part and front computing panel part to an electrical device in an interior of the bag.

24. A display frame for holding an electronic display, the display frame comprised of:
   a. a bag comprised of a front wall including a top end;
   b. an attachment frame comprising a proximal edge, and a distal edge, wherein the attachment frame is configured to hold an electronic display;
   c. a pivoting computer equipment mount attached to the bag and comprised of a free section extending from the bag and attaching to the proximal edge of the attachment frame; and
   d. a prop on or near the proximal edge of the attachment frame wherein the prop extends toward the bag front wall while the free section suspends the attachment frame, the prop configured to abut the bag front wall and hold the attachment frame at one or more operating position angles relative to the bag front wall.

25. The display frame of claim 24 wherein the attachment frame is further comprised of one of a front side display panel portion including a display, a back side display panel portion including a touch pad and a display/control combination panel.

26. The display frame of claim 25 further comprised of an electrical connection on one of the front side display panel portion, back side display panel portion and display/control combination panel wherein the connection is configured to electrically connect to other electrical equipment.

27. The display frame of claim 25 further comprised of a touch screen control on the display.

28. The display frame of claim 24 wherein the attachment frame is comprised of an attachment frame front side and an attachment frame back side.

29. The display frame of claim 28 wherein one of the attachment frame front side and the attachment frame back side includes a pivoting computer equipment mount display panel part.

30. The display frame of claim 28 wherein the attachment frame front side and the attachment frame back side are pivotally attached to each other.

31. The display frame of claim 24 wherein the attachment frame is shaped to be easily handled.

32. The display frame of claim 24 wherein the attachment frame is further comprised of a back side including a finger guide and a finger guide opening to allow access to a touch pad held in the attachment frame and help an operator find a control.

33. The display frame of claim 24 further comprised of a tool attached to the attachment frame and an electrical connection connected to the tool and configured to electrically connect the tool to other electrical equipment.

34. The display frame of claim 24 wherein the attachment frame is hollow to pass an electrical connection from a tool located on the frame through the frame for connection to other electrical equipment.

35. The display frame of claim 24 wherein the attachment frame includes a pivoting computer equipment mount display panel part adapted to attach to an attachment flap.

36. The display frame of claim 24 wherein the free section is comprised of an attachment flap.

37. A display frame for holding an electronic display to a bag, the display frame comprised of:
   a. an attachment frame comprising a proximal edge and a distal edge wherein the attachment frame is configured to hold an electronic display;
   b. a pivoting computer equipment mount display panel part on or near the proximal edge configured to pivotally attach the attachment frame to a free section attached to the bag; and
   c. a prop on or near the proximal edge of the attachment frame wherein the prop extends toward the bag while the free section suspends the attachment frame, the prop configured to abut the bag and hold the attachment frame at one or more operating position angles relative to a front wall of the bag.

38. The display frame of claim 37 wherein the attachment frame is further comprised of one of a front side display panel portion including a display, a back side display panel portion including a touch pad and a display/control combination panel.

39. The display frame of claim 38 further comprised of an electrical connection on one of the front side display panel portion, back side display panel portion and display/control combination panel wherein the connection is configured to electrically connect to other electrical equipment.

40. The display frame of claim 38 further comprised of a touch screen control on the display.

41. The display frame of claim 37 wherein the attachment frame is comprised of an attachment frame front side and an attachment frame back side.

42. The display frame of claim 41 wherein one of the attachment frame front side and the attachment frame back side includes a pivoting computer equipment mount display panel part.

43. The display frame of claim 41 wherein the attachment frame front side and the attachment frame back side are pivotally attached to each other.

44. The display frame of claim 37 wherein the attachment frame is shaped to be easily handled.

45. The display frame of claim 37 wherein the attachment frame is further comprised of a back side including a finger guide and a finger guide opening to allow access to a touch pad held in the attachment frame and help an operator find a control.

46. The display frame of claim 37 further comprised of a tool attached to the attachment frame and an electrical connection connected to the tool and configured to electrically connect the tool to other electrical equipment.

47. The display frame of claim 37 wherein the attachment frame is hollow to pass an electrical connection from a tool located on the frame through the frame for connection to other electrical equipment.

48. The display frame of claim 37 wherein the attachment frame includes a pivoting computer equipment mount display panel part adapted to attach to an attachment flap.

49. An electronic display device for pivotally attaching to an object, the display device comprised of:
   a. a display/control combination panel including a display side with a display and a control side with a touch pad;
   b. an attachment frame comprised of a proximal edge and a back side including a finger guide and a finger guide opening wherein the attachment frame is configured to hold the display/control combination panel with the display/control combination panel control side adjacent to the attachment frame back side; and
   c. a pivoting computer equipment mount display panel part on or near the attachment frame proximal edge and configured to pivotally attach the attachment frame to the object.

50. The display device of claim 49 further comprised of an electrical connection attached to the display/control combination panel and configured to electrically connect the display/control combination panel to other electrical equipment.

* * * * *